(12) United States Patent
Bertrana

(10) Patent No.: US 6,208,848 B1
(45) Date of Patent: Mar. 27, 2001

(54) RADIO RECEIVER SQUELCH CIRCUIT WITH AUTOMATIC ADJUSTMENT OF THE SQUELCH THRESHOLD

(75) Inventor: Albert Bertrana, Perpignan (FR)

(73) Assignee: Groupe President Electronics, Balaruc (FR)

( * ) Notice: Subject to any disclaimer, the term of this patent is extended or adjusted under 35 U.S.C. 154(b) by 0 days.

(21) Appl. No.: 09/122,221

(22) Filed: Jul. 24, 1998

Related U.S. Application Data

(63) Continuation of application No. PCT/FR97/00134, filed on Jan. 23, 1997.

(30) Foreign Application Priority Data

Jan. 25, 1996 (FR) .................................................. 96 00857

(51) Int. Cl.[7] .................................................. H04B 1/10
(52) U.S. Cl. .......................................................... 455/218
(58) Field of Search .................................... 455/218, 221, 455/107, 224, 213, 222

(56) References Cited

U.S. PATENT DOCUMENTS 2,770,721   11/1956   Clark .
3,979,679    9/1976   Bush et al. .
4,044,309    8/1977   Smith .

Primary Examiner—William Cumming

(57) ABSTRACT

A radio receiver for receiving audio frequency communications conveyed by a high-frequency carrier and occurring randomly over time. In addition to the tuning circuits, a director, an audio frequency amplifier and a speaker, the receiver includes a controlled switch connected between the detector and the amplifier for disabling or re-enabling the transfer of the audio signal from the detector to the speaker. A filter and second detector set a silence threshold to provide squelch and are arranged to set the silence threshold in accordance with the level of a part of the audio spectrum from the first named detector that contains only noise and is located outside the frequency band of the signal representing the useful audio communication to be received. The receiver is particularly suitable for use in citizen's band equipment.

7 Claims, 4 Drawing Sheets

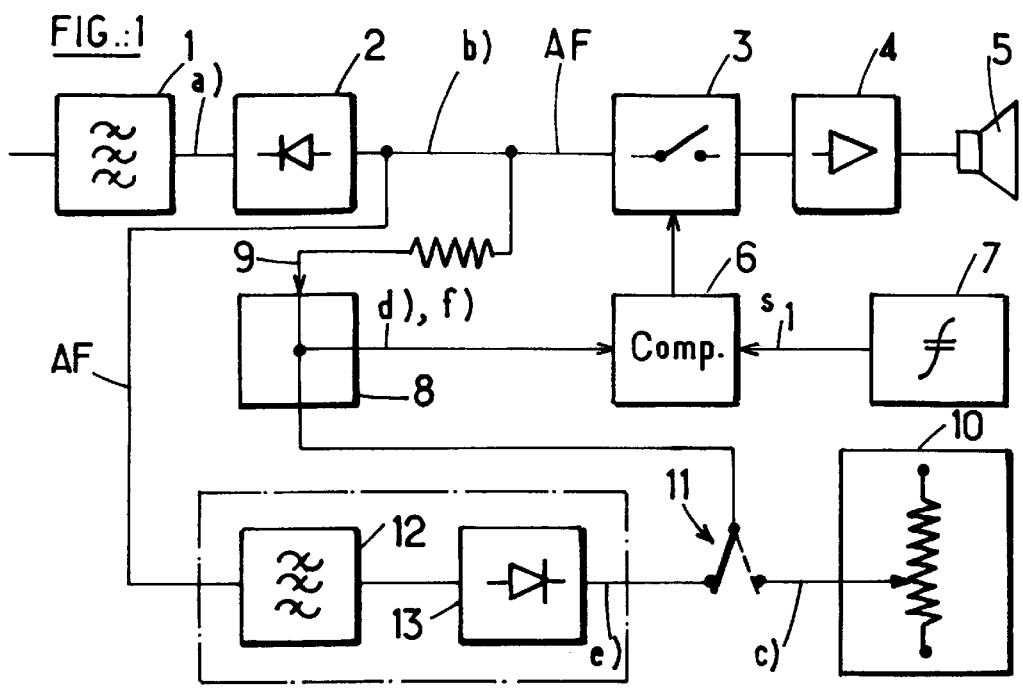
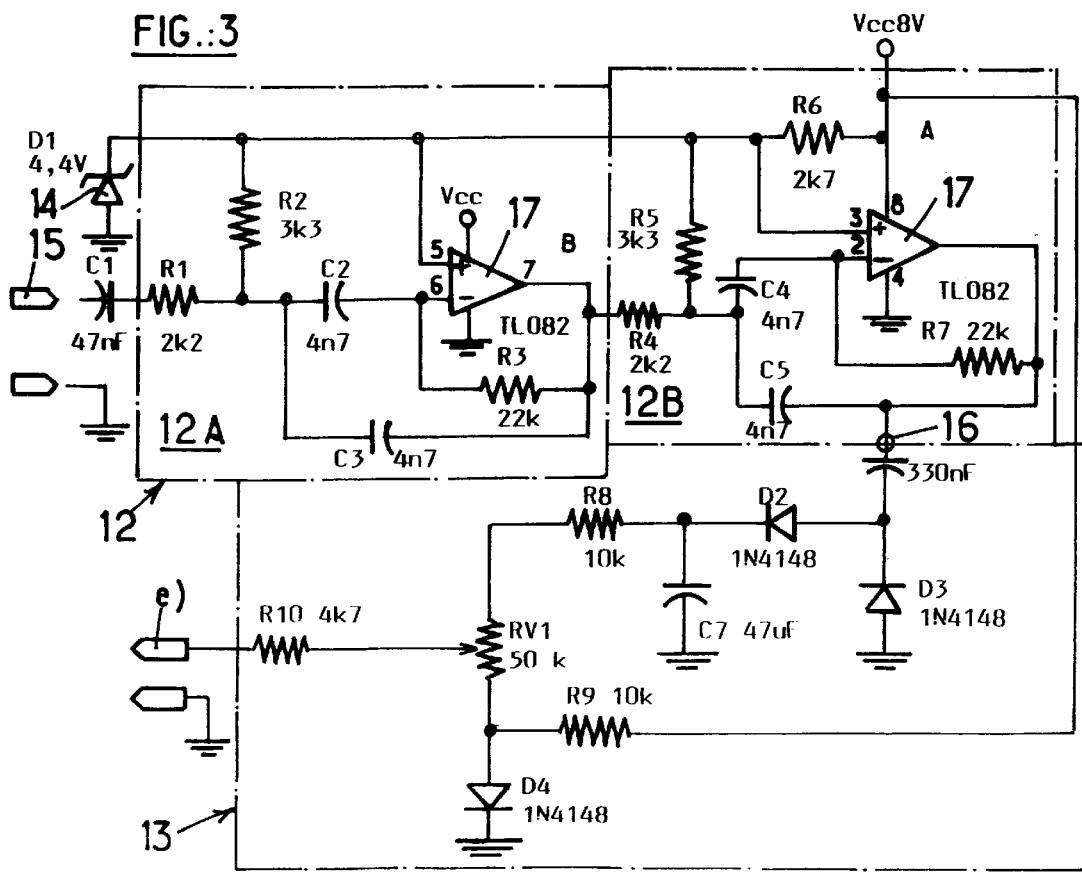

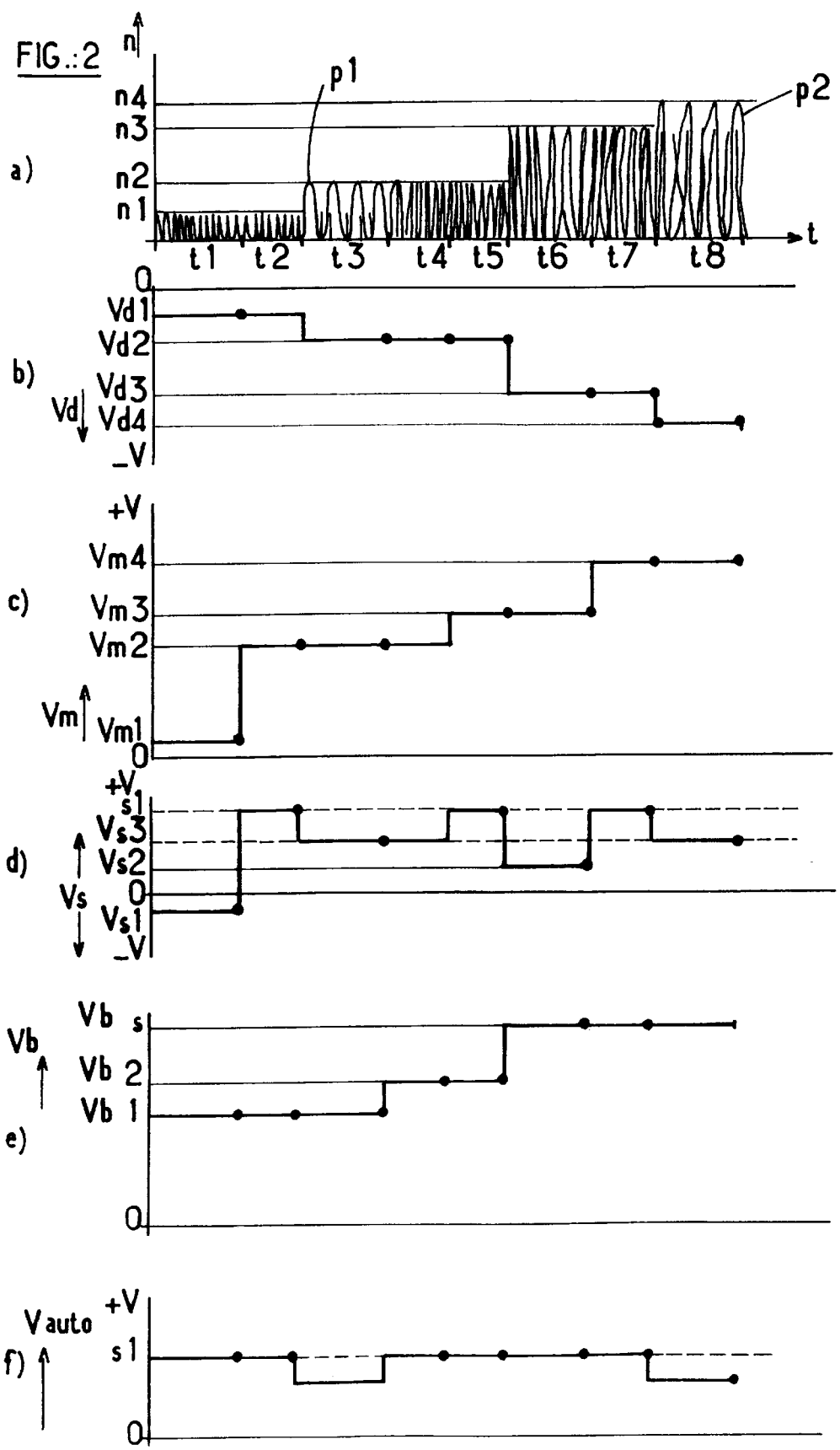

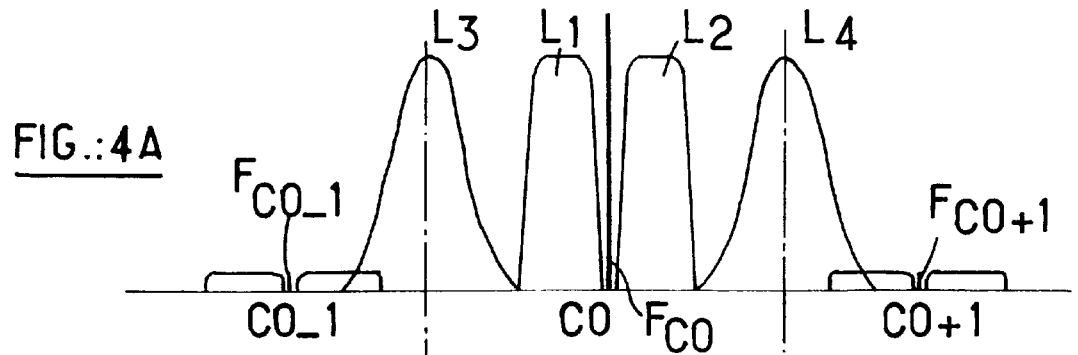
FIG.: 4A
FIG.: 4B
FIG.: 4C

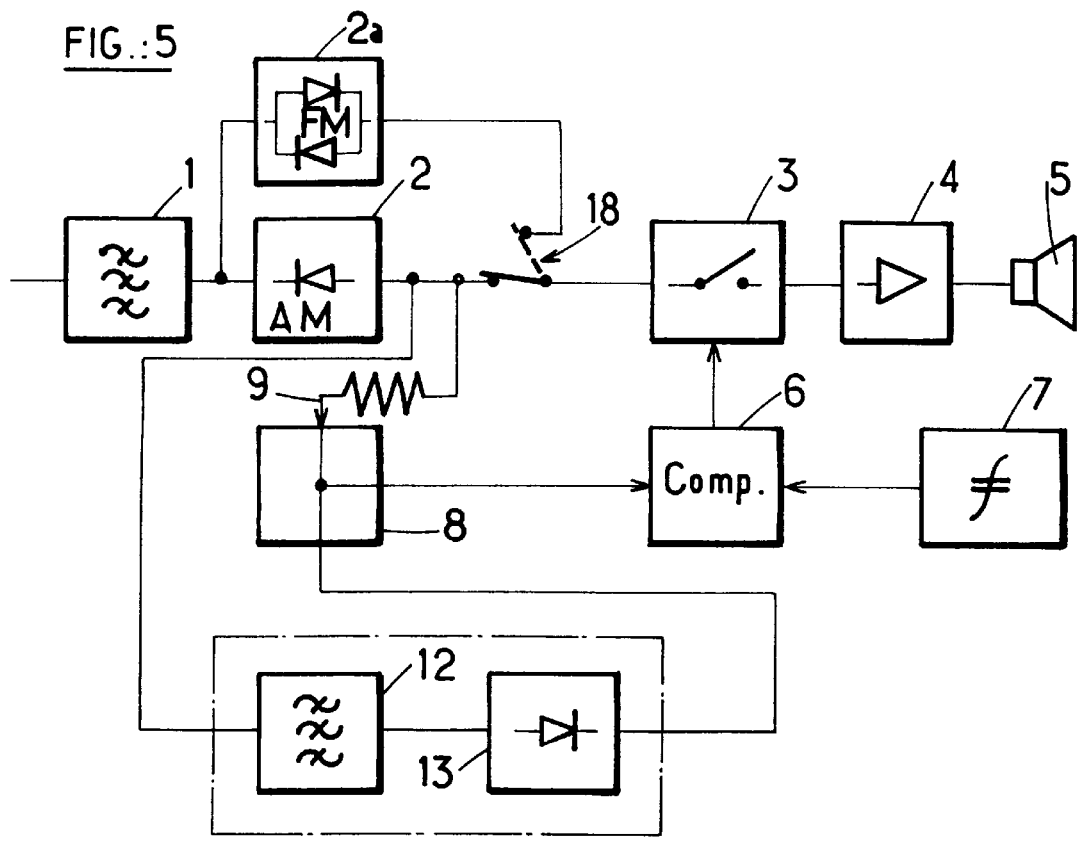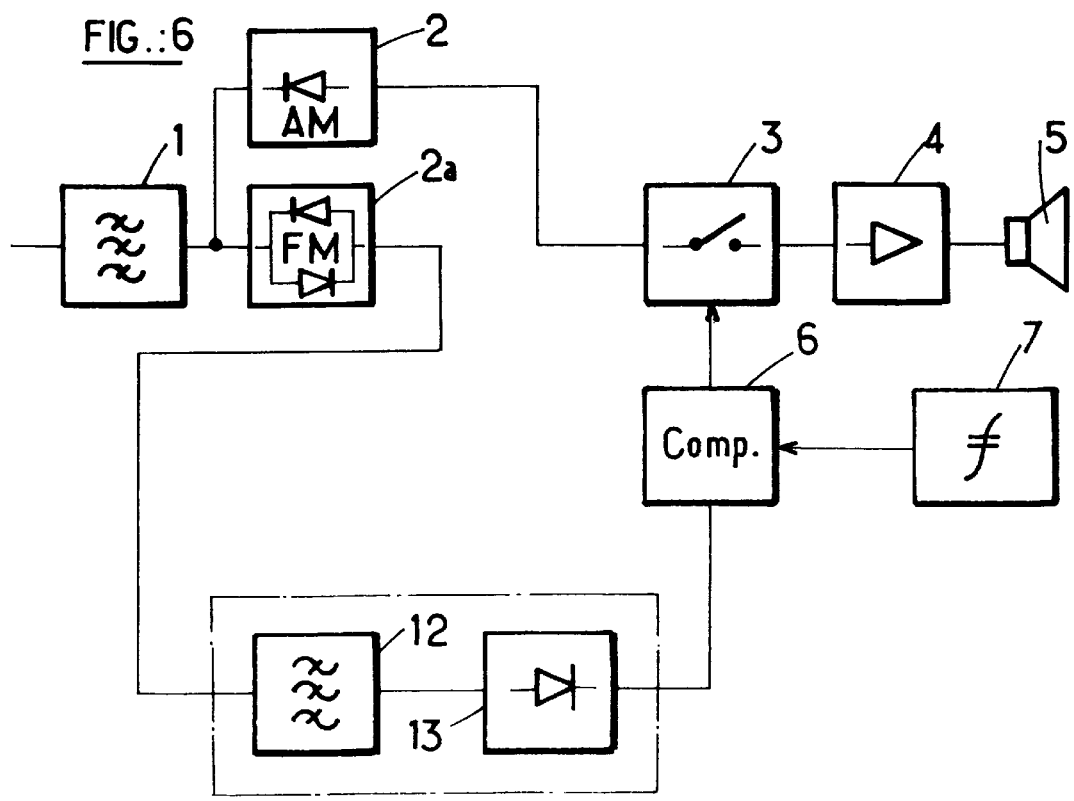

RADIO RECEIVER SQUELCH CIRCUIT WITH AUTOMATIC ADJUSTMENT OF THE SQUELCH THRESHOLD

This application is a continuation of International Application No. PCT FR97/00134 filed Jan. 23, 1997.

BACKGROUND OF THE INVENTION

1. Field of the Invention

The present invention relates to a squelch circuit for a radio receiver designed to receive communications that occur at random.

2. Description of the Related Art

One typical example of a radio receiver of the above kind is the device which at present forms part of a transmitter/receiver system employing in particular amplitude modulation for radio communication, in particular voice communication, between individuals. Depending on the country, the frequencies used are in the range 26 MHz to 28 MHz, usually known as the "citizen's band".

By their very nature, the times at which communications in this frequency band take place are random so that to receive communications the receiver must be set to a standby mode, after setting it to a particular channel in the given frequency band, so that if a caller comes onto that channel the message is received so that the user can respond if appropriate using the transmitter of his own installation. Consequently, the loudspeaker or other sound transducer connected to the receiver must be connected at all times to the output of the receiver in the standby mode.

Thus when a transmitter/receiver system of the above kind operates in the amplitude modulation mode, unless particular measures are taken, the receiver feeds to the loudspeaker not only a wanted voice signal if any, but also a continuous sound signal produced by the receiver from all forms of interference signals and atmospheric noise reaching the receive antenna. Under these conditions the user constantly hears background noise containing a whole range of audible frequencies (white noise), which is extremely disagreeable after a while.

This is why this kind of receiver has for many years been fitted with a squelch circuit. This device automatically reduces the sound level output by the sound transducer in the absence of a wanted signal and re-establishes this sound level as soon as the received signal is of sufficiently high level.

U.S. Pat. No. 2,770,721 discloses a radio receiver equipped with a squelch circuit controlled by a voltage derived from two voltage components formed in the following fashion.

The output of the detector is connected to a filter which discriminates in the spectrum of the detector a frequency band beginning at an audible frequency of 1000 Hz. The output signal of the filter is amplified and rectified to produce the first voltage component of the squelch control signal.

The prior art radio receiver is described with reference to two versions, one for frequency modulation and the other for amplitude modulation. The frequency modulation version of the receiver includes at least one limiter from which is derived the second voltage component which with the first voltage component forms the resultant squelch control voltage already mentioned.

Moreover, the amplifier connected to the filter for producing the first voltage component includes a device for manually adjusting the squelch threshold to be imposed on the system and from which the squelch circuit operates.

The above document also shows a schematic of an amplitude modulation receiver. In a receiver of this kind there is usually no amplitude limiter. However, in this second version of the receiver described in the document under discussion two amplitude limiters are added (they can usually be dispensed with in an amplitude modulation receiver) so that the second voltage component referred to above is available so that the squelch control signal can be "artificially" generated in the same fashion as described in the context of the frequency modulation receiver.

In both versions of the receiver described in U.S. Pat. No. 2,770,721 the user must adjust the squelch threshold manually employing a potentiometer associated with the amplifier which amplifies the noise signal at the output of the detector.

Apart from the fact that the amplitude modulation version is unnecessarily complex because of the presence of two amplitude limiters, it has a number of other drawbacks. First of all, the noise level in the signal reaching the receiver antenna is not constant and depends on a whole series of highly random factors, for example the time of day (because of movements of the upper atmosphere layers), local reception conditions, especially if the receiver is onboard a vehicle (passing under a bridge or through a tunnel), sunspots, changing propagation conditions, etc.

This is why adjustment of the squelch threshold is useful so that users can do their best to track the changing conditions of the noise level in the receive signal, whence the incorporation into the prior art receiver of the manual adjustment potentiometer previously mentioned. However, apart from the disadvantage of having to adjust the squelch threshold frequently in line with variations in the received noise level (especially in the case of a receiver onboard a vehicle), there is also the risk of the user adjusting the squelch threshold at a time when the received noise level is high, with the result that not only the noise but also all wanted signals below the set level will be eliminated. However, if the received noise level decreases afterwards, the user will not register this because the receiver will remain silent even though wanted transmissions received at a moderate level are no longer buried in noise, the level of which has fallen. Such transmissions could therefore be received normally but they are eliminated because the manual adjustment of the automatic squelch system has not been altered to suit the new, lower noise level.

Another drawback of the prior art receiver (in both the frequency modulation and the amplitude modulation versions) is the fact that the first voltage component of the squelch control signal is formed on the basis of a large part of the energy represented by the wanted voice frequencies, typically from 1000 Hz.

The squelch could therefore become operative unnecessarily if the wanted signal contained a large proportion of these higher frequencies in the voice spectrum transmitted by the radio communication system. This is why the prior art receiver must compensate for this by generating a third voltage component employed in the generation of the squelch control signal, acting in opposition to the first component and based on the lower frequencies in the voice spectrum. This further complicates the system and introduces the risk of distortion of wanted information that the user should normally receive if the latter information is composed entirely or intermittently of frequencies above 1000 Hz.

BRIEF SUMMARY OF THE INVENTION

The aim of the invention is to remedy all the drawbacks described and to provide a squelch circuit for a radio receiver in which adjustment of the squelch threshold is entirely automatic.

The invention therefore consists in a squelch circuit with automatic adjustment of the squelch threshold for a radio receiver of the type adapted to receive audio frequency communications conveyed by a radio-frequency carrier, said receiver including tuning circuits, at least one detector, means for amplifying audio frequencies and a sound transducer, said squelch circuit comprising:

switch means connected to said amplifier means and capable of interrupting or establishing connection of the audio frequency signal from said detector to said sound transducer, filter and detector means for producing a squelch control signal from the frequency spectrum contained in the output signal of said detector, characterised in that said filter and detector means are adapted to form said control signal in accordance with the energy contained in a frequency band of said audio frequency spectrum corresponding exclusively to frequencies outside the frequency band of the signal representing the audio frequency communication transmitted by the received transmitter, and in that said filter and detector means are connected to a comparator also connected to threshold fixing means for producing said squelch control signal by comparison with a predetermined fixed threshold value.

Because of the above features, the squelch threshold is determined continuously and entirely automatically without the user having to adjust the threshold manually, a signal reaching the loudspeaker of the receiver only if the signal/ noise ratio has an acceptable value for satisfactory listening to the wanted information.

U.S. Pat. No. 4,044,309 discloses the use of a squelch circuit in which a signal is generated from the output of the detector by means of a filter tuned to a band from 4000 Hz to 15000 Hz, i.e. outside the voice frequency band. However, in this case, the output signal of the filter is compared with a voice signal level and the squelch signal is generated on the basis of this comparison.

A squelch circuit of the kind disclosed in this prior patent procures only partial attenuation of the audio frequency signal fed to the sound transducer in all cases where the transmitter received is not modulated and in particular if the speaker at the transmitting end is thinking or "hesitates as to what he wants to say". This produces a very disagreeable crack in the sound transducer each time the circuit suddenly attenuates the signal when the speaker stops speaking although the transmitter continues to transmit and each time the circuit restores reproduction when the speaker starts speaking again.

In accordance with other features of the invention, said filter and detector means are connected to said comparator by a summing device adapted to sum said squelch signal and a signal representing the RF level of the signal from said detector and said comparator is adapted to compare this sum with said fixed threshold value.

Said filter and detector means can be connected either to an AM detector or to an FM detector of the radio receiver incorporating the squelch circuit of the invention. If the receiver is capable of receiving AM signals and FM signals, the filter and detector means producing said control signal are preferably connected to the AM detector of the receiver.

BRIEF DESCRIPTION OF THE DRAWINGS

Other features and advantages of the invention will become apparent in the following description given by way of example only and with reference to the accompanying drawings, in which:

FIG. 1 is a highly simplified block schematic of part of a radio receiver equipped with an automatically adjusted squelch circuit of the invention;

FIG. 2 shows a number of explanatory graphs illustrating the operation of a squelch circuit with manual adjustment of the squelch threshold and a squelch circuit of the invention in which adjustment of the squelch threshold is entirely automatic;

FIG. 3 is a detailed circuit schematic of filter and detector means for use in the receiver from FIG. 1;

FIGS. 4A through 4C show graphs illustrating the theory of the invention; and

FIGS. 5 and 6 show two embodiments of the invention.

DETAILED DESCRIPTION

FIG. 1 is a schematic of part of a radio receiver equipped with a squelch circuit in accordance with the invention with automatic adjustment of the squelch threshold. The receiver conventionally comprises the usual tuning circuits of which only the last circuit 1 is shown and constitutes the intermediate frequency stage.

The intermediate frequency stage 1 is connected to a detector 2 followed by a switch circuit 3. The latter is connected to a power amplifier stage 4 driving a loudspeaker 5, all of this being known in itself. The detector 2 delivers an audio frequency signal and a DC voltage the level of which represents the received radio-frequency level.

The switch circuit 3 is connected to a comparator 6 adapted to compare a fixed threshold value set in a threshold circuit 7 to a sum signal established at a summing node 8.

The summing node 8 receives a DC voltage representing the RF level via the connection 9 connected to the detector 2 and a squelch adjustment voltage. In the context of the invention, this latter voltage can be supplied by a manual adjustment circuit 10 which includes a manually adjustable potentiometer but it must be emphasised that this manual adjustment circuit can be entirely omitted in practice, the only reason for including it here being that it enables the advantages of the invention over the prior art to be illustrated.

For purposes of explanation, the voltage at the cursor of the potentiometer 10 can be applied to the node 8 via a switch 11 which for the time being is assumed to be in the "manual" position shown in dashed line.

The sum is compared to a squelch threshold supplied by the circuit 7 in the comparator 6 the output circuit of which controls the switch circuit 3.

FIG. 2 illustrates the behaviour of the part of the circuit from FIG. 1 just described as a function of time. The time axis is divided into eight periods t1 through t8 each of which corresponds to a situation that can arise while the receiver is listening out for wanted communications. The lengths of these periods are arbitrarily chosen and different to show that in reality the periods can have lengths that are dependent only on circumstances.

The FIG. 2 graphs show the voltages at the points in the FIG. 1 schematic designated by the same reference letters a) through f). Graph a) shows the RF level, examples p1 and p2 indicating that the received wanted signal is at a higher level than the noise, even if the latter continues at a level slightly less than that of the wanted signal.

The threshold circuit 7 imposes a threshold value si at which the connection between the amplifier 4 and the detector 2 is broken. Otherwise the amplifier 4 is connected to the detector 2.

If it is assumed that the squelch threshold can be adjusted manually, as was always the case in the prior art, the system would operate as follows during the eight periods illustrated at a) in FIG. 2.

During period t1 the RF signal is formed of noise at level n1 which gives at b) a negative voltage Vd1 at the output of the detector 2. Assume that the user has manually chosen a low setting of the squelch threshold by means of the potentiometer 10, which signifies at c) a low positive voltage Vm1 applied to the summing node 8 by the manual adjustment circuit 10. The voltages Vd and Vm have opposite polarities and their values are such that the voltage Vs resulting from summing at the node 8 and represented at d) is slightly negative and in all cases significantly less than the threshold s1 (voltage Vs1). Consequently, the amplifier 4 is connected to the detector 2 and the noise is perceptible in the loudspeaker 5.

Assume that during period t2 the user no longer wishes to hear the noise in the loudspeaker 5. To this end, and again manually by means of the potentiometer 10, the user raises the squelch threshold, increasing the voltage at c) to the value Vm2 until the voltage at d) reaches the squelch threshold s1. The switch circuit 3 then disconnects the amplifier 4 from the detector 2 so that the loudspeaker 5 remains silent.

Period t3 corresponds to the appearance in the RF signal of a carrier p1 (graph a) that may be carrying wanted information. The level of this carrier is above the noise level. The detected negative voltage increases and the value at b) falls to the level Vd2, the voltage Vm remaining at the same level Vm2. Under these conditions the voltage Vs at d) falls below the threshold s1 as a result of which the comparator 6 commands the switch circuit 3 to connect the amplifier 4 to the detector 2. The wanted communication on the carrier p1 can then be perceived in the loudspeaker. During period t2 the voltage Vm is set to the squelch threshold and the slight increase in the RF level at a) due to the carrier p1 activates the amplifier 4.

During period t4, neither the RF signal level nor the manual adjustment changes, but the carrier p1 has disappeared or has become buried in the noise, the level of which has increased. Consequently, the values of the voltages Vd at b) and Vs at d) are maintained and the amplifier 4 remains connected. The loudspeaker reproduces the noise.

During period t5 the manual adjustment voltage is altered to re-establish silence (value Vm3 at c)). This increases the voltage Vs at d) to the threshold s1 and disconnects the amplifier 4.

Period t6 corresponds to a further increase in the received noise level n3. The voltage Vd at b) falls (value Vd3) and, the adjustment voltage Vm at c) not being modified by the operator, the voltage Vs at d) falls below the threshold si and the amplifier 4 is connected. The loudspeaker 5 reproduces the noise.

The period t7 has the same consequences as the period t5 and the period t8 has the same consequences as the period t3, apart from the levels of the various signals. During period t8 the high-frequency signal again contains a carrier p2 containing a wanted communication.

The cases just examined show clearly the drawbacks of manual adjustment. If the squelch threshold is set to eliminate the noise in period t5 (Vm=Vm3), for example, and if the noise level then falls, for example to the lower level of period t3, the carrier p1 appearing during this period will not be perceived because the loudspeaker 5 is disconnected at this time given that the voltage Vs at d) continues to reach the threshold s1. The wanted communication is not passed to the loudspeaker.

The invention remedies this problem by providing means for automatically adjusting the squelch threshold, eliminating the need for the potentiometer 10.

Accordingly, in accordance with the invention, the output of the detector 2 is connected to a filter stage 12 connected to a detector stage 13. The output of the detector stage 13 supplies an automatic adjustment signal Vb at e) which is applied to the switch 11 to be transmitted to the summing node 8 when the switch 11 is set to the position corresponding to automatic adjustment of the squelch threshold.

FIG. 3 represents one example of the filter 12 used to implement the invention. A zener diode 14 determines the DC working level of the filter. It is connected in series with a resistor R6 to a voltage supply (not shown) which delivers a voltage Vcc. In the present example the filter stage 12 is made up of two identical filter sections 12A and 12B connected in series between an input 15 and an output 16. The passband of the two filter sections 12A and 12B is adjusted to a range above 3000 Hz, i.e. above the range of voice frequencies, this range preferably extending from 3000 Hz to 8000 Hz, a practical implementation preferably using a range from 4000 Hz to 7000 Hz.

The values of the components of the two sections indicated in FIG. 3 correspond to this latter preferred range, but it should be noted that these values are given here by way of example only, as are the values of the components of the detector stage 13. Each filter section comprises an operational amplifier 17 which can be of the TL082 type, for example, available off the shelf. This amplifier increases the signal level given that the tuning circuit of the receiver tends to attenuate the parts of the spectrum outside the frequency band of the wanted communication signal.

The output 16 of the second filter stage 12B is connected to the detector stage 13 which includes a full-wave rectifier comprising diodes D2 and D3 and a smoothing capacitor C7. The rectifier is connected to the series-connector combination of a resistor R8, an adjustment potentiometer RV1 and a diode D4. The potentiometer RV1 adjusts the base level of the detector stage 13. It is set once and for all by the manufacturer and its role is therefore in no way comparable with that of the potentiometer 10 for manually adjusting the squelch threshold. Also, the potentiometer RV1 can be replaced by fixed resistors fitted by the manufacturer.

FIGS. 4A through 4C graphically illustrate the implementation of the invention by representing a frequency spectrum at the input of the detector 2, the receiver being tuned to a channel C0 with carrier frequency $F_{C0}$, the spectrum also containing the signals on adjacent channels C0−1 and C0+1 with respective carrier frequencies $F_{C0-1}$ and $F_{C0+1}$ strongly attenuated by the tuning stages of the receiver.

FIG. 4A shows the reception of a double sideband amplitude modulation or frequency modulation signal. The distance between the carrier frequencies $F_{C0}$, $F_{C0-1}$ and $F_{C0+1}$ is 10 kHz in the example represented which is more particularly concerned with the citizen's band in which channels are at frequencies in the range 26 MHz to 28 MHz, depending on national legislation.

The FIG. 4A graph shows the lobes L1 and L2 of the wanted two sidebands extending over a range of frequencies of approximately 3000 Hz either side of the central carrier frequency $F_{C0}$ and two lobes L3 and L4 which delimit sidebands containing no information related to wanted communications and the filter stage 12 is therefore tuned to the corresponding audio frequencies. The energy represented by these sidebands L3 and L4 depends on the overall noise level reaching the antenna of the receiver and which would therefore appear at the output of the detector 2. As a result the output 16 of the filter stage 12 supplies a signal at an amplitude that varies with the received noise level. This signal is rectified in the detector stage 13 which produces the DC voltage Vb whose value depends on the received noise level. In other words, the variations in the voltage Vb at e) (FIG. 2) represent information by means of which the squelch threshold can be automatically adjusted to allow for the reception conditions in which the receiver is operating without being influenced by the energy contained in the lobes L1 and L2 containing wanted communications. Thus adjustment of the squelch threshold is automatic and the level of this threshold always corresponds to the value required to eliminate unwanted noise in the loudspeaker during periods of silence in which no wanted signal is received and to transmit the wanted signal to the loudspeaker with the correct level as soon as it reaches the receiver. The wanted signal causes a voltage to appear at the output of the detector 2 which after summing at the node 8 constitutes a voltage (Vauto at f)) lower than the squelch threshold, the effect of which is to connect the amplifier 4 to the detector 2.

FIGS. 4B and 4C show that the concept of the invention can also be applied in the presence of single sideband amplitude modulation, the single sideband being the upper one in FIG. 4B and the lower one in FIG. 4C. Note that the invention applies equally to situations using angular frequency or phase modulation (see FIG. 4A).

Graphs e) and f) of FIG. 2 illustrate how the filter stage 12 and the detector stage 13 are involved in the automatic adjustment of the squelch threshold. It is clear that the voltage Vb at e) tracks only the noise level in the RF signal during all periods t1 through t8. As a result, considering periods t3 and t4, for example, in the case of automatic adjustment (switch 11 in the position shown in full line in FIG. 1), the voltage Vauto (graph f) shows different values during these periods whereas in the case of manual adjustment the voltage Vs at d) has the same values. Consequently, in the automatic mode, in which the switch 11 is in the position shown in FIG. 1, the loudspeaker is open during period t3 so that the wanted communication contained in the carrier p1 can be heard but is closed during period t4 instead of being open as in the manual adjustment situation.

Similarly, during period t6, the voltage Vauto at f) produces silence despite the fact that a higher noise level appears which in the case of manual adjustment would cause the loudspeaker 5 to be connected.

To summarise, because of the invention, in the automatic adjustment of the squelch threshold mode, the behaviour of the receiver is modified compared to the behaviour in the manual mode of adjustment of this threshold, during periods t1, t4 and t6 in the sense of automatic adjustment of the squelch threshold without the user having to adjust the latter manually.

It is obvious that in the automatic squelch threshold adjustment mode the risk of the user setting the threshold to too high a level, which would prevent the user receiving communications in which the RF level is slightly higher than the noise level, is eliminated.

Finally, note that, as shown in FIG. 1, the automatic and manual adjustment modes can co-exist in the same squelch circuits of the invention for automatic adjustment of the squelch threshold, so that the user has the option of operating the receiver in either of these modes. It is nevertheless clear that the presence of the components providing the manual adjustment (potentiometer 10) is not mandatory for the invention to be put entirely into practice.

FIG. 5 shows one variant of the squelch circuits of the invention with automatic adjustment of the squelch threshold in a radio receiver able to receive amplitude modulation signals and frequency modulation signals in the usual way.

In this case, the intermediate stage 1 is connected to an amplitude modulation detector 2 from which the input signal to the filter 12 and the RF level signal to the switch 8 are taken. The intermediate frequency stage is also connected to a frequency modulation detector 2a, the detector 2 or the detector 2a being connected to the switch 3 by a selector 18. Note that the FIG. 5 situation illustrates the fact that the squelch circuit of the invention can have no facility for manual adjustment of the squelch threshold.

FIG. 6 shows another variant of the invention in which the squelch circuit is incorporated into an amplitude modulation radio signal receiver. Here the intermediate stage 1 is connected to the amplitude modulation signal detector 2 which is connected to the switch circuit 3. The filter 12 is connected to another frequency modulation signal detector 2a which in this case is used exclusively to supply the input signal of the filter 12. Likewise there is no facility for manual adjustment of the squelch threshold here.

What is claimed is:

1. A radio receiver adapted to receive transmissions comprising a radio-frequency carrier onto which wanted audio frequency communications are amplitude modulated, said receiver including tuning circuits (1) delivering a frequency spectrum with at least one sideband comprising at least one lobe (L1, L2) delimiting the wanted communications to be received and at least one lobe (L3, L4) containing no information relating to the wanted communications, at least a first detector (2) supplying an audio frequency signal representing said communications and a first DC voltage representing the level of the received radio-frequency carrier, means (4) for amplifying said audio frequency signal, a sound transducer (5) connected to said amplifier means, switch means (3) connected between said first detector (2) and said amplifier means (4) and adapted to block the passage of said audio frequency signal from said first detector (2) to said sound transducer (5), and a squelch circuit adapted to generate a signal for controlling said switch means (3) in accordance with a particular squelch threshold, said squelch circuit including (i) filter and detector means (12, 13) comprising a bandpass filter connected to a second detector (13) to generate a second DC voltage, and (ii) means for summing said DC voltages to generate said control signal in accordance with said combination, the output of said summing means (8) being connected to a comparator (6) also connected to threshold fixing means (7) to produce said control signal by comparison with a predetermined fixed threshold value, wherein said filter and detector means (12, 13) comprise a bandpass filter (12) tuned to the lobe (L3, L4) containing no information related to wanted communications and which is connected to receive directly said audio frequency signal (AF) from a point downstream of said first detector (2).

2. A receiver according to claim 1, wherein the pass-band of the filter stage (12) is adjusted so that the lower cut-off frequency is equal to or greater than 3000 Hz.

3. A receiver according to claim 1 capable of receiving amplitude modulation and frequency modulation transmissions and further comprising an AM detector and an FM detector and said AM detector (2) is connected to said filter and detector means (12, 13).

4. A receiver according to claim 2 wherein said filter (12) has a passband the higher cut-off frequency of which is less than or equal to 8000 Hz.

5. A receiver according to claim 4 wherein the pass-band of said filter (12) is in the range 4000 Hz to 7000 Hz.

6. A receiver according to claim 1 further comprising manual control means (10) for manually generating a voltage serving as said second DC voltage and means (11) for switching between said second detector (13) and said manual control means (10).

7. A receiver according to claim 2 capable of receiving amplitude modulation and frequency modulation transmissions and further comprising an AM detector and an FM detector and said AM detector (2) is connected to said filter and detector means (12,13).

* * * * *